(12) United States Patent
Khasgiwala et al.

(10) Patent No.: US 10,469,079 B1
(45) Date of Patent: Nov. 5, 2019

(54) TECHNIQUES TO INCREASE ACCURACY OF PROXIMITY-SENSOR MEASUREMENTS

(71) Applicant: Amazon Technologies, Inc., Seattle, WA (US)

(72) Inventors: Mudit Sunilkumar Khasgiwala, Milpitas, CA (US); Serkan Hatipoglu, Campbell, CA (US)

(73) Assignee: Amazon Technologies, Inc., Seattle, WA (US)

( * ) Notice: Subject to any disclaimer, the term of this patent is extended or adjusted under 35 U.S.C. 154(b) by 58 days.

(21) Appl. No.: 15/839,465

(22) Filed: Dec. 12, 2017

(51) Int. Cl.
| | |
|---|---|
| *H04B 1/10* | (2006.01) |
| *H03K 17/955* | (2006.01) |
| *G06F 3/0346* | (2013.01) |
| *G06F 3/01* | (2006.01) |
| *G06F 3/0488* | (2013.01) |
| *G06F 3/041* | (2006.01) |

(52) U.S. Cl.
CPC ........... *H03K 17/955* (2013.01); *G06F 3/017* (2013.01); *G06F 3/0346* (2013.01); *G06F 3/0416* (2013.01); *G06F 3/0488* (2013.01)

(58) Field of Classification Search
CPC ......... H04B 1/3838; H04L 2012/2841; H04M 1/7253; H04M 2250/12; H04W 52/283; H04W 52/367; H04W 72/0446
USPC ........................................ 455/317, 33.3, 263
See application file for complete search history.

(56) References Cited

U.S. PATENT DOCUMENTS

| | | | |
|---|---|---|---|
| 10,212,667 B1 * | 2/2019 | Govindassamy | ............................ H04W 52/0258 |
| 2018/0331706 A1 * | 11/2018 | Nys | ........................ G06F 3/0416 |

* cited by examiner

*Primary Examiner* — Tu X Nguyen
(74) *Attorney, Agent, or Firm* — Lee & Hayes, P.C.

(57) ABSTRACT

The techniques described herein mitigate the effects of electromagnetic interference, caused by the sending or receiving of data, on a proximity sensor of an electronic device. In some instances, capacitance values measured by the proximity sensor may be inaccurate during times at which the electronic device is sending or receiving data. To mitigate this effect, the techniques take into account the recurrent time slot(s) at which the electronic device is scheduled to send or receive data, and then disregards the capacitance values measured by the proximity sensor at these times.

20 Claims, 6 Drawing Sheets

TECHNIQUES TO INCREASE ACCURACY OF PROXIMITY-SENSOR MEASUREMENTS

BACKGROUND

Electronic devices are ubiquitous in today's society. People use tablet computing devices, mobile phones, electronic book readers, laptop computers, and the like for an array of recreational and/or work-related activities. As use of these devices increase, so do concerns about the impacts on the human body of electromagnetic radiation from such use. To lessen these impacts, some mobile devices utilize proximity sensors that detect the presence of a human and, in response, lessen the power sent to an antenna or other component of the mobile devices. For instance, when a user places a phone call on a mobile device, the proximity sensor of the mobile device may detect the presence of the human user near the device and, in response, may lessen the power sent to the antenna of the device, thereby reducing the amount of electromagnetic radiation that the human user is subject to. Unfortunately, power consumption by components of the mobile device may result in inaccurate data generated by the proximity sensor, thus degrading the reliability of this data.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

The techniques described herein mitigate the effects of electromagnetic interference, caused by the sending or receiving of data, on a proximity sensor of an electronic device. In some instances, capacitance values measured by the proximity sensor may be inaccurate during times at which the electronic device is sending or receiving data. To mitigate this effect, the techniques take into account the recurrent time slot(s) at which the electronic device is scheduled to send or receive data, and then disregard the capacitance values measured by the proximity sensor at these times. By disregarding these values, the techniques lessen or eliminate the amount of false-positive proximity events detected by the proximity sensor.

As noted above, electronic devices, such as those devices that send and/or receive data, may emit electromagnetic radiation, which at certain levels may be harmful to users that are proximate to these devices. As such, certain regulatory agencies sometimes set limits for safe exposure to radio-frequency electromagnetic radiation, known in some instances as a "Safe Absorption Rate" (SAR). A SAR may indicate the maximum amount of radio-frequency electromagnetic radiation that a human body should be exposed to. Therefore, some electronic devices, such as a mobile phone, may utilize proximity sensors to determine when a human body is proximate to—that is, within a threshold distance of—the mobile phone or other device. In response to the proximity sensor indicating that a human body has been detected within the threshold distance, the electronic device may perform one or more predefined actions for lessening the amount of radio-frequency electromagnetic radiation emitted from the device. For example, the device may power down or provide less power to one or more of its components (e.g., its antenna(s), etc.), may select a different component to perform a predefined action (e.g., switching from a first antenna to a second antenna), or the like.

Proximity sensors may function to detect the presence of nearby objects, without physical contact, using an array of technologies. For instance, proximity sensors may emit an electromagnetic field or radiation (e.g., an infrared beam) and may identify the changes in the field or return signal to determine whether an object is within a threshold distance of the proximity sensor. Proximity sensors may comprise capacitive proximity sensors, inductive proximity sensors, magnetic proximity sensors optical proximity sensors, and/or the like. In each instance, the proximity sensor may acquire proximity-sensor values over time and may compare these values to threshold values to determine whether the sensor is within the threshold distance to an object, such as a human user. For example, a capacitive proximity sensor may measure capacitance values over an antenna or other component to determine whether the sensor is within the threshold distance of the object.

In some instances, however, one or more components of an electronic device that includes a proximity sensor may emit energy that interferes with the accuracy of the proximity sensor. For instance, these components may emit electromagnetic energy that causes proximity-sensor values to be higher, thus triggering the detection of a proximity event in instances where an object is not in fact within the threshold distance to the sensor.

To illustrate, a proximity sensor may generate an electrostatic field, if it is a capacitive proximity sensor, or an electromagnetic field, if it is an inductive proximity sensor. In the example of a capacitive proximity sensor, when an object nears a sensing surface of the sensor, the object enters the electrostatic field of the sensor, which changes the capacitance in an oscillator circuit of the sensor. This change in the capacitance in the oscillator circuit causes to oscillator to begin oscillating. A trigger circuit of proximity sensor may then determine the now-increased amplitude of the oscillator and compare this amplitude to a threshold amplitude. If the oscillator amplitude is greater than the threshold amplitude, then the proximity sensor may generate an indication of a proximity event—that is, an indication that an object is within a predefined, threshold distance of the sensing surface of the sensor. When the object moves away from the sensing surface and, thus, out of the electrostatic field of the oscillator, the amplitude may lessen to an amount that is less than the amplitude threshold, thus causing the sensor to indicate that the proximity event is no longer occurring.

Although movement of an object into the electrostatic field of the oscillator may increase the oscillator amplitude, in some instances the sending and/or receiving of data also increase this amplitude. For instance, when the device sends or receives data over an antenna, the energy associated with this sending or receiving causes the oscillator to begin oscillating, similar to instances where an object, such as a human finger, is within a threshold distance of the sensing surface of the proximity sensor. In some instances, this may cause the amplitude of the oscillator to increase beyond the amplitude threshold, thus causing the proximity sensor to generate an indication of a proximity event. Given that these higher proximity-sensor values (e.g., oscillator amplitude that is greater than a frequency) are caused by the sending or receiving of data from the device, however, the indication of the proximity event may be representative of a false positive rather than a true proximity event caused by the movement of an object to within the electrostatic field of the oscillator. Of course, while the above example describes a capacitive touch sensor, similar problems may occur for an inductive proximity sensor, an optical proximity sensor, or any other type of proximity sensor where the sensor's values are artificially increased due to the energy associated with sending or receiving data at the device.

For instance, a radio frequency (RF) component, such as a modem of a mobile phone, may increase capacitance values measured by a capacitive proximity sensor while sending and/or receiving data over an antenna of the device. That is, as discussed immediately above, the energy associated with the sending or receiving of data over the antenna of the device may cause the oscillator of the proximity sensor to begin oscillating, thus increasing the measured values of the proximity sensor. This may be particularly acute if the proximity sensor uses the same antenna as the RF component. In these instances, the RF component uses the antenna to send and receive data, while the proximity sensor uses the antenna to measure changes in the electrostatic field. Therefore, the energy associated with the sending and/or receiving of data is concentrated at the antenna over which the data is being sent or received. Thus, given that the proximity sensor is measuring the changes in the electrostatic field at this same location, the effects are greater on the proximity-sensor values than if the proximity sensor utilizes an antenna that is isolated (e.g., remote from) the antenna used by the RF component.

Furthermore, while the effects of the sending and/or receiving of data is exacerbated when the RF component and the proximity sensor use a common antenna, the effects may also be significant if the proximity sensor acquires capacitance values using an antenna that is near an antenna used by the RF component to send and/or receive data—that is, if isolation between these antennas is less than a certain threshold. In these instances, the energy associated with the sending and receiving of data over the RF antenna may again interfere with the electrostatic field of the oscillator, which is relatively near the RF antenna, causing the oscillation amplitude to increase, potentially resulting in a false-positive detection of a proximity event.

The techniques described herein, however, may mitigate the effects of the RF component sending and/or receiving data on the proximity sensor by partially or entirely removing the effects of the electromagnetic interference caused by the sending and/or receiving of data on the determinations made by the proximity sensor. In some instances, the techniques may mitigate these affects using a synchronous method—in which information about the timing of the sending and/or receiving of data by the RF component is taken into account—and using an asynchronous method—in which information about this timing is not taken into account.

In the synchronous method, the techniques may include determining when the RF component is scheduled to send and/or receive data, disregard measurements taken during this time (or refrain from making said measurements), and determine the existence of proximity events based on times when the RF component is not scheduled to send or receive data. That is, logic within the electronic device may determine when the RF component is scheduled to send and/or receive data, and may refrain from acquiring proximity-sensor values during this time, may disregard data acquired during these times when determining whether a proximity event exists, or may disregard indications of proximity events when these indications occur during these times. That is, in some instances the techniques described below may refrain from acquiring proximity-sensor data during times at which the RF component is scheduled to send and/or receive data. For instance, the proximity sensor may be powered off or otherwise inactive at these times. In still other instances, the proximity sensor may acquire proximity-sensor data at this time, but the data is not used when determining whether a proximity event exits. For instances, this data—corresponding to times at which the RF component is scheduled to send and/or receive data—may be removed from the register prior to performing proximity-event calculations. In other instances, meanwhile, the proximity sensor may continue to acquire proximity-sensor values without regard to whether the data is associated with a time at which the RF component is scheduled to send and/or receive data. However, when a proximity-event indication is generated, logic on the electronic device may determine whether the time of this indication corresponds to a time at which the device was scheduled to send and/or receive data. If so, then the indication (e.g., an interrupt) may be disregarded.

In some instances, the electronic device may use time-division duplexing (TDD) or other techniques, in which a network over which the electronic device communicates assigns time slots to devices on the network for sending and/or receiving data. For instance, the network may assign a first time slot for an electronic device to send data, a second time slot for the electronic device to receive data, or may assign a single time slot at which the electronic device is configured to send and receive data. The techniques described herein may apply to any system in which an electronic device is able to determine when it is to going to send and/or receive data, such as TDD systems, time-division multiple access (TDMA) systems, frequency-division duplexing (FDD) systems, frequency-divisions multiple access (FDMA) systems, WiFi systems (which may utilize TDD or FDD techniques in some instances), or any other networks, protocols, or systems in which the electronic device is able to determine when it is to send and/or receive data.

When an electronic device determines a time slot at which its RF component is scheduled to send and/or receive data, the electronic device may store data indicating the time slot at which the RF component is scheduled to send and/or receive data. In some instances, the RF component may be assigned recurrent time slots, such that the device is able to determine a series of future times at which the device is scheduled to send and/or receive data, or the time slot may be a one-time slot in instances where the device sends and/or receives data at different, non-recurrent times. In instances where the RF component is assigned recurrent time slots, the electronic device stores data indicating the values of these recurrent time slots at which the RF component is scheduled to send and/or receive data.

In each instance, after storing the data indicating the time at which the device is to send or receive data, the device may disregard information generated by the proximity sensor during this time. For example, in some instances the proximity sensor may continue to generate values (e.g., capacitance values) based on capacitance values at an antenna and store these values in a register or other memory. A proximity-sensor component may then compare these values to a predefined threshold to determine whether a proximity event exists—that is, when an object (such as a human user) is within a threshold distance of the device. In some instances, these values may represent an amplitude of the capacitance at the antenna. If this amplitude is greater than a threshold amplitude, then the proximity-sensor component or other logic may output an indication (e.g., an interrupt) of a proximity event. In some instances, the threshold may be associated with a threshold amount of time as well, such that the proximity-sensor component or the additional logic on the device outputs the indication of the proximity event if the measured amplitude is greater than threshold amplitude for the threshold amount of time.

If the proximity-sensor component determines that the object is within the predefined distance, the proximity-sensor component may generate an indication of the proximity event. For example, the proximity-sensor component may generate an interrupt indicating the existence of the proximity event. Logic of the device may then determine a time corresponding to the indication and determine whether this time corresponds to a time at which the device was scheduled to send and/or receive data. If so, then the device may disregard the indication and take no action, given that the values acquired by the proximity sensor may have been corrupted by electromagnetic interference of the RF component sending and/or receiving data. If, however, the time does not correspond to a time at which the device was scheduled to send and/or receive data, then the device may perform one or more predefined actions, depending on the application executing on the device. In one example, the device may lower the power provided to the antenna, to reduce the SAR value.

In other instances, the proximity sensor may refrain from acquiring proximity-sensor values during times corresponding to when the device is scheduled to send and/or receive data. For example, the proximity-sensor component may determine, prior to instructing the proximity sensor to acquire a proximity-sensor value, whether the current time corresponds to a time (e.g., a recurrent time slot) at which the device is scheduled to send and/or receive data. If so, then the proximity-sensor component may instruct the proximity sensor to refrain from acquiring a proximity-sensor value. For instance, the proximity-sensor component may power off the proximity sensor at this time. Thus, the proximity sensor only acquires values at times at which the device is not scheduled to send or receive data and, thus, the proximity-sensor values are not influenced by electromagnetic interference caused by the RF component. Therefore, any indications (e.g., interrupts) generated by the proximity-sensor component may be relied upon as valid and, thus, the device may perform its predefined action(s) in response to receiving such an indication.

In still other instances, the proximity sensor may acquire values (e.g., capacitance values), during the time when the device is scheduled to send and/or receive data. However, those values may be disregarded. For example, the proximity-sensor component may delete, from memory, the values. Thus, any determinations regarding whether a current proximity event exists made by the proximity-sensor component may exclude values corrupted by electromagnetic interference caused by the RF component sending and/or receiving data. Stated otherwise, the proximity-sensor component may compute its calculations without taking into account proximity-sensor values acquired at a time corresponding to a time at which the RF component is scheduled to send and/or receive data. Instead, the proximity-sensor component may limit the proximity-sensor values used for these calculations to those values acquired by the proximity sensor at time(s) that do not correspond to the time slot(s) at which the device is scheduled to send and/or receive data.

In still other instances, the proximity-sensor component may refrain from deleting proximity-sensor values having times corresponding to when the device was scheduled to send and/or receive data, but may instead refrain from using these values when comparing proximity-sensor values to the threshold. Again, this may result in the proximity-sensor component generating indications of proximity events that are not influenced by electromagnetic interference from the RF component sending and/or receiving data.

In addition or in the alternative to taking into account when the RF component of the device is scheduled to send and/or receive data, the proximity-sensor component may utilize filtering techniques to lessen the effects of the electromagnetic interference on the determination of proximity events.

In one example, logic of the device may train a model indicating proximity-sensor values typically sensed by the proximity sensor during human motion, and thus during times when a human user is in fact within the threshold distance of the device. This model may then be later used to disambiguate proximity-sensor values caused by an object being detected (e.g., a human user) and those caused by electromagnetic interference. For instance, the model may be used to determine certain frequency bands in the proximity-sensor values associated with the sending and/or receiving of data by the RF component rather than those frequency bands associated with the human or other object being detected. In some instances, the model may indicate that higher-frequency proximity-sensor values are associated with electromagnetic interference, while lower-frequency values are associated with an object that is proximate to the surface of the proximity sensor. Therefore, in some instances a signal that is generated based on subsequently-acquired proximity-sensor values may be input to a filter (e.g., a high-pass filter) to remove or attenuate a component of the signal corresponding to a frequency range indicated by the model as often corresponding to the electromagnetic interference of the RF component.

In other instances, the logic may be configured to differentiate RF-component noise from proximity-sensor values corresponding to the object being detected by determining average (e.g., mean or median) values associated with the object being tracked. A signal generated based on the subsequent proximity-sensor values may then be input to a filter (e.g., a low-pass filter) that is configured to remove or attenuate component(s) of the signal having a frequency that differs from the determined average or mean by greater than a threshold. Thus, the components of the signal corresponding to the RF-induced noise may be removed from the signal, without losing components of the signal based on the capacitance values caused by an object that is proximate to the device.

Figure 1A:
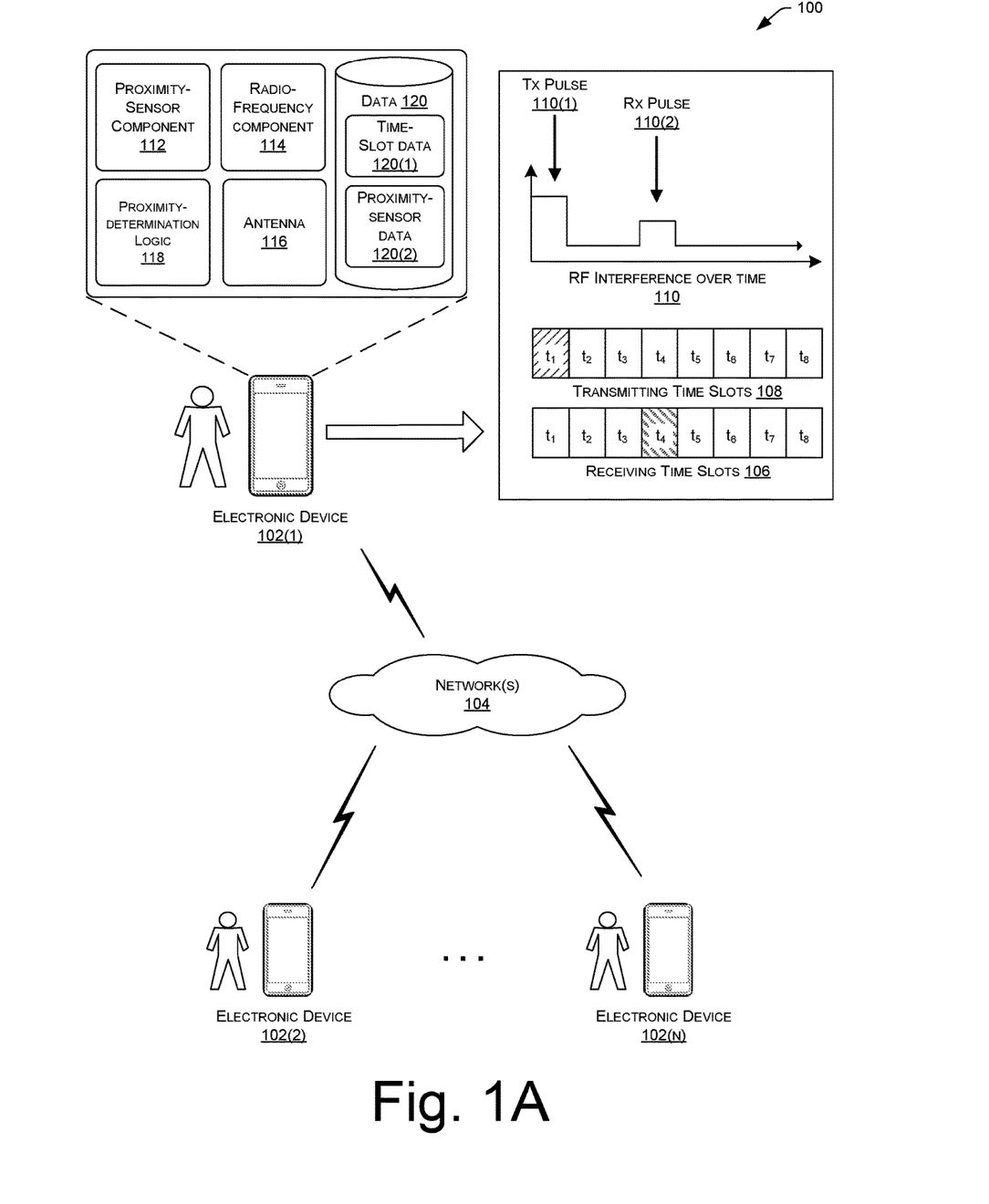
FIGS. 1A-1B illustrates an example architecture in which electronic devices send and receive data over one or more networks at respective recurrent time slots. In some instances, these devices may include logic to disregard data generated by the respective device's proximity sensors at times corresponding to when the devices are scheduled to send or receive data.

FIG. 1A illustrates an example architecture 100 in which electronic devices 102(1), 102(2), . . . 102(N) send and receive data over one or more networks 104. In some instances, the network(s) 104 utilize TDD, TDMA, FDD, FDMA, or other systems where each device 102(1)-(N) is assigned one or more time slots at which the respective devices are allowed to send and/or receive data. In some instances, the time slots are recurrent time slots, while in other instances these times are non-recurrent, assigned on-the-fly, and/or the like. Further, it is to be appreciated that the networks 104 represent cellular networks, wireless (e.g., WiFi) networks, and the like. Therefore, the techniques described herein may apply to cellular technologies (e.g., GSM, 3G, 4G, CDMA, etc.) and wireless technologies, such as WiFi.

In the illustrated example, the network 104 has assigned, to the example device 102(1), a recurrent receiving time slot 106 at which the device 102(1) is scheduled to receive data over the network 104, and a recurrent transmitting time slot 108 at which the device 102 is scheduled to transmit data to other devices over the network 104. As illustrated, the receiving time slot 106 corresponds to a fourth time slot of eight possible time slots, while the transmitting time slot 108 corresponds to a first time slot of eight possible time slots. In some instances, a network may facilitate the sending of data between devices over multiple different frequency channels, and within each frequency channel may assign time slots to different devices such that multiple devices can send data over the same frequency channel. In some instances, a device may be assigned a first time slot for sending data in a first frequency channel and a second time slot for receiving data in a second frequency channel. In some instances, meanwhile, the first time slot and the second time slot may correspond to the same frequency channel. In still other instances, the device may be assigned a single time slot in a single frequency channel for both sending and receiving data.

FIG. 1A further illustrates the radiofrequency (RF) interference 110 over time, caused by the sending and receiving of data by the electronic device. As illustrated, the RF interference 110 may include a pulse 110(1) that occurs during the transmitting time slot 108 and is caused by the transmitting of data by the device. In addition, the RF interference 110 includes a pulse 110(2) that occurs during the receiving time slot 106 and is caused by the receiving of data by the device. As described above, this RF interference, and particularly the interference illustrated by the pulses 110(1) and 110(2) may result in erroneous detection of proximity events by a proximity sensor of the electronic device 102(1), as discussed below.

FIG. 1A illustrates that the device 102(1) may include a proximity-sensor component 112, a radiofrequency (RF) component 114, one or more antennas 116, proximity-determination logic 118, and data 120. The proximity-sensor component 112 may, in some instances, comprise an integrated circuit or microchip configured to acquire capacitance values from the antenna 116. In some instances, the proximity-sensor component 112 acquires capacitance values and provides this to one or more processors or system-on-chip (SOC), while in other instances the proximity-sensor component 112 may compare these capacitance values to a capacitance threshold to determine whether a proximity event exists. If so, then the proximity-sensor component 112 may generate an indication, such as an interrupt, that indicates the existence of the proximity event. In response to receiving this indication, the SOC or another component of the device 102(1) may cause performance of one or more predefined actions. For example, the SOC, discussed below with reference to FIG. 1B, may lessen power provided to the antenna 116 or cause performance of one or more additional actions.

The proximity-sensor component 112 may couple to a sensor element, which in this example may comprise the antenna 116. In other instances, the sensor element may comprise a separate antenna or other component. In addition, the proximity-sensor component 112 may include a sensing surface, such as two concentrically shaped metal electrodes of an unwound capacitor. The proximity-sensor component 112 may further include an oscillator circuit, whose capacitance may change as an object nears the sensing surface. The proximity-sensor component 112 may further include a trigger circuit, which may read the oscillator's amplitude and which may, in some instances, cause the proximity-sensor component 112 to output an indication of a proximity event if the amplitude is greater than a threshold amplitude (potentially for a threshold amount of time). In some instances, the threshold amplitude may be determined based on a dielectric constant of an object that the proximity-sensor component 112 has been designed to detect, such as a human.

In some instances, the capacitance values acquired by the proximity-sensor component 112 may be influenced by the RF interference from the transmitting pulse 110(1) and/or the receiving pulse 110(2). That is, the energy associated with the sending or receiving of data by the RF component 114 may cause artificially high capacitance values acquired by the proximity-sensor component 112, which if left unresolved may result in false-positive proximity events. This may be particularly true in instances where the RF component 114 sends and/or receives data over the antenna, while the proximity-sensor component 112 also acquires capacitance values at the antenna 116. However, the techniques described below illustrate multiple techniques for mitigating these artificially high capacitance values.

As will be appreciated, however, while the proximity-sensor component 112 may comprise a capacitive proximity sensor, in other instances the device 102(1) may utilize an inductive proximity sensor, an optical proximity sensor, or the like. Further, while FIG. 1A illustrates that the proximity-sensor component 112 utilizes the same antenna 116 as the RF component 114, in some instance the proximity-sensor component 112 utilizes a separate antenna.

Upon acquiring capacitance or other types of values, the proximity-sensor component 112 may store this information in a register or other type of memory, illustrated as data 120 in FIG. 1A. It is to be appreciated that the device 102 may utilize a system-on-a-chip, processors and memory, and/or the like. In some instances, the data 120 includes the proximity-sensor data 120(2) (also referred to as proximity-sensor values) measured by the proximity-sensor component 112, as well as the time-slot data 120(1) indicating the recurrent time slots 106 and 108 currently assigned to the device 102(1). In addition, the data 120 may include information such as a threshold over which a proximity event is determined to exist.

The RF component 114, meanwhile, may comprise any type of device component configured to receive and/or receive data over the network 104 using the antenna 116. For instance, in the example of the device 102(1) comprising a mobile phone, the RF component 114 may comprise a modem of the phone. As stated above, the RF component 114 may be configured to transmit data to one or more remote devices during the transmitting time slot 108 and may be configured to receive data from one or more remote devices during the receiving time slot 106. However, given that the RF component 114 and the proximity-sensor component 112 each utilize the antenna 116, the proximity-sensor values generated by the proximity-sensor component 112 during the sending and receiving of the data by the RF component 114 may be artificially high as compared to what the proximity-sensor values would be without the electromagnetic interference.

The proximity-determination logic 118, meanwhile, may determine the existence of a proximity event by comparing proximity-sensors values determined by the proximity-sensor component 112 and comparing these values to one or more thresholds. In some instances, the proximity-determination logic 118 may determine whether or not a proximity event exists without reference to proximity-sensor values at the times associated with the recurrent time slots at which the RF component 114 of the device 102(1) is scheduled to send and/or receive data.

For example, in one example the proximity-determination logic 118 may be configured to disregard interrupts generated at times corresponding to one or both of the receiving recurring time slot 106 and/or the transmitting recurring time slot 108. For example, the proximity-determination logic 118 may determine, from the time-slot data 120(1), when the RF component 114 is scheduled to send and/or receive of data. Thereafter, if the proximity-sensor component 112 generates an indication (e.g., an interrupt) indicating that there is a proximity event (e.g., that an object, such as a human, is within the threshold distance to the proximity sensor), then the proximity-determination logic may determine whether the time at which the indication was generated corresponds to a time associated with one of the recurrent time slots 106 or 108. If so, then the proximity-determination logic 118 may disregard the indication and refrain from performing a predefined action associated with a proximity event. If the time of the indication is not associated with one of the recurrent time slots 106 or 108, however, then the proximity-determination logic 118 may determine that a valid proximity event exists and may cause execution of one or more predefined actions, such as sending less power to the antenna 116. In another example, the predefined action may comprise causing the proximity-sensor component 112 to switch from acquiring proximity-sensor values (e.g., capacitance values) from a first of the antennas 116 to a second of the antennas 116.

In other instances, the proximity-sensor component 112 may be configured to disregard proximity-sensor values acquired during times corresponding to one of the recurrent time slots 106 and/or 108. For instance, when comparing proximity-sensor values to the threshold, the proximity-sensor component 112 may use one or more first proximity-sensor values taken at times that do not correspond to the recurrent time slots, while refraining from using one or more second proximity-sensor values acquired at times corresponding to these time slots. In other instances, the proximity-sensor component 112 may remove from memory the one or more second proximity-sensor values such that the proximity-sensor component 112 does not use those values that correspond to the recurrent time slots.

In still other instances, the proximity-sensor component 112 may refrain from acquiring proximity-sensor values during times corresponding to the recurrent time slots 106 and 108. For instance, the proximity-sensor component 112 may power on during times that do not correspond to the recurrent times slots 106 and 108 while powering off at times corresponding to these time slots. Therefore, the proximity-sensor component 112 does not use values acquired during the sending or receiving of data by the RF component 114, as no such values are acquired.

Figure 1B:
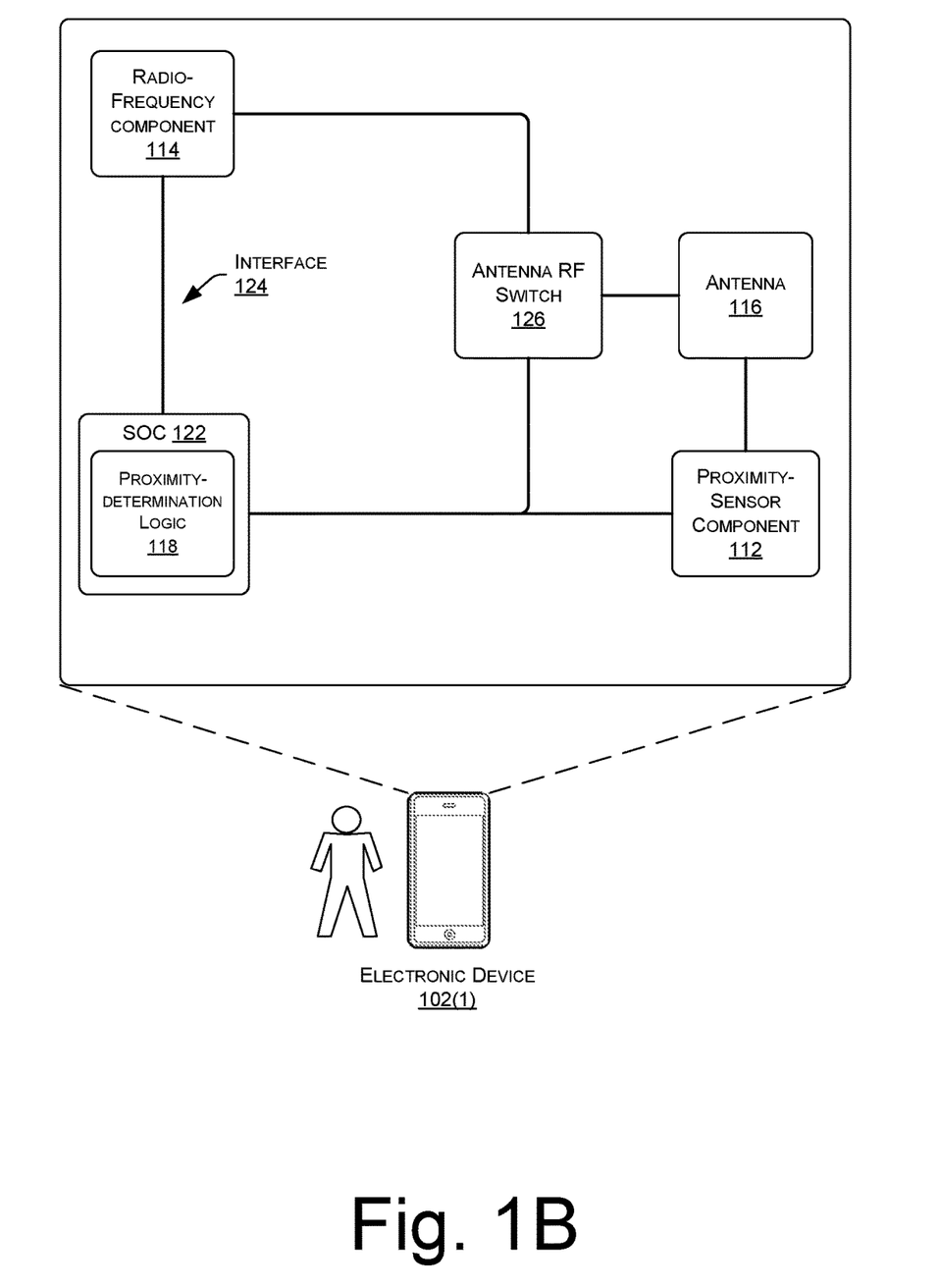

FIG. 1B illustrates additional details of one example implementation of the electronic device 102(1). In this example, the device 102(1) utilizes a system-on-a-chip (SOC) 122, on which the proximity-determination logic 118 resides. The SOC 122 may communicate with the RF component 114 over an interface 124, such as a Universal Serial Bus (USB) interface or the like. In other instances, the RF component 114 may instead reside on the SOC 120.

FIG. 1B further illustrates that the RF component 114m may send and receive data over the antenna 116 via an antenna RF switch 126. In addition, the proximity-sensor component 112 may utilize the antenna 116 to acquire proximity-sensor values and send these values to storage provided by the SOC 120. Of course, while FIG. 1B illustrates the proximity-sensor component 112 sharing the antenna with the RF component 114, in other instances the proximity-sensor component 112 may utilize a separate antenna.

Figure 2:
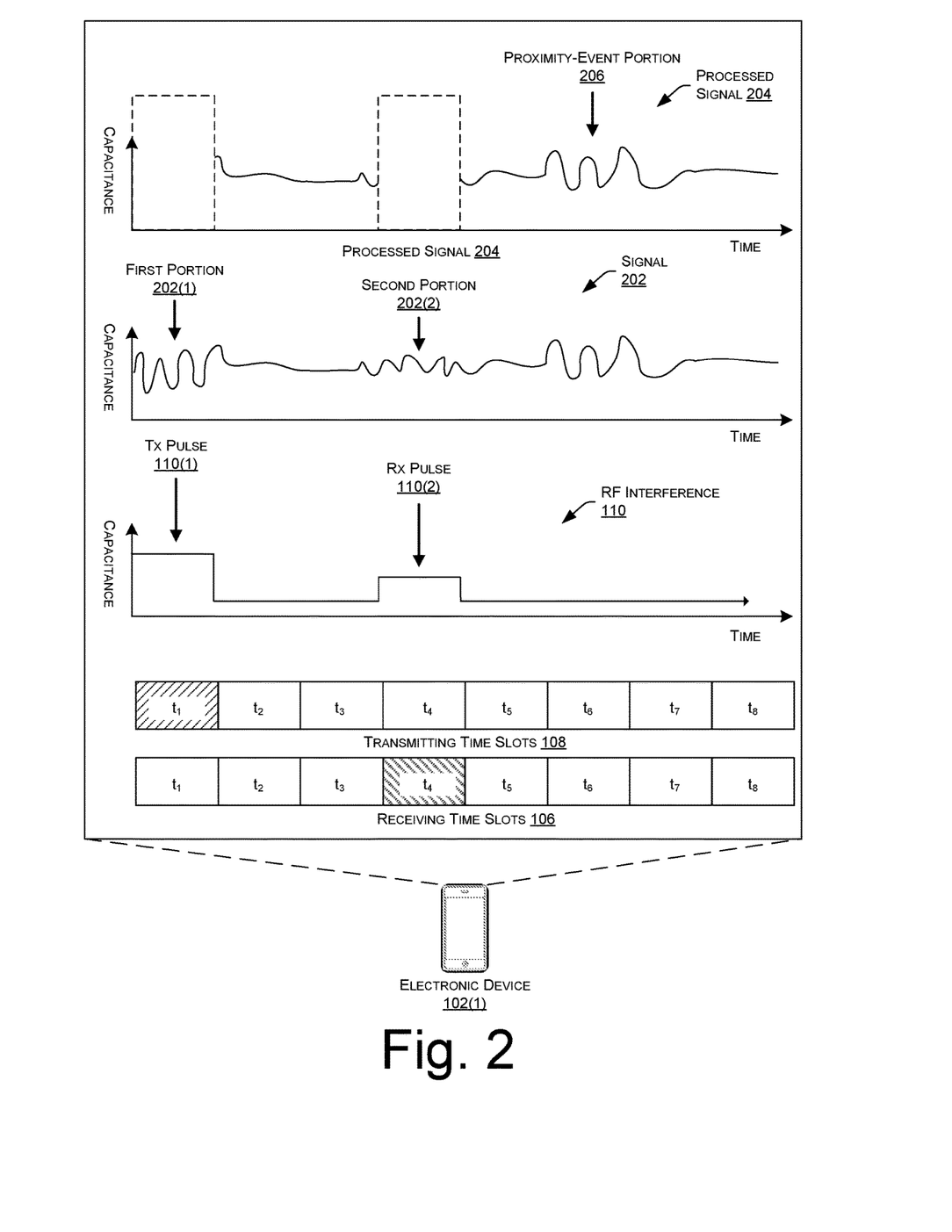
FIG. 2 illustrates an example scenario where the proximity-sensor values corresponding to recurrent time slots at which the electronic device is scheduled to send and receive data are disregarded, thus decreasing the possibility of the proximity sensor falsely detecting a proximity event.

FIG. 2 illustrates an example scenario where the proximity-sensor values corresponding to recurrent time slots at which the electronic device is scheduled to send and receive data are disregarded, thus decreasing the possibility of the proximity sensor falsely detecting a proximity event. As in FIG. 1A, in FIG. 1B the electronic device 102(1) has been assigned the receiving time slot 106 and the transmitting time slot 108. Therefore, the proximity sensor of the device 102(1) may experience RF interference, including interference based on the transmitting pulse 110(1) and the receiving pulse 110(2).

Further, FIG. 2 illustrates that the proximity-sensor component 112 has acquired capacitance values from the antenna 116 and has generated a signal 202 that is representative of these values. As illustrated, the signal 202 include a first portion 202(1) that represents capacitance values that are based at least in part on the electromagnetic interference caused by the transmitting pulse 110(1) and a second portion 202(2) that represents capacitance values that are based at least in part on the electromagnetic interference caused by the receiving pulse 110(2).

FIG. 2 illustrates, however, that the proximity-sensor component 112 and/or the proximity-determination logic 118 may further generate a processed signal 204, which disregards or does not include the portions of the signal 202(1) and 202(2) corresponding in time to the receiving and sending of the data by the RF component 114. For instance, the capacitance values corresponding to the time at which the RF component 114 was transmitting data may be removed from memory, or may be ignored by the proximity-determination logic 118. Similarly, a second portion 202(2) of the signal 202 corresponding to the time of the RF component 114 of the device 102(1) receiving data may be removed or disregarded. By removing or disregarding these portions of the signal 202(1) and 202(2), the proximity-determination logic 118 may refrain from identifying false-positive proximity events at this time. Instead, the proximity-determination logic 118 may identify a portion of the signal 206 that is representative of a true proximity event.

Figure 3:
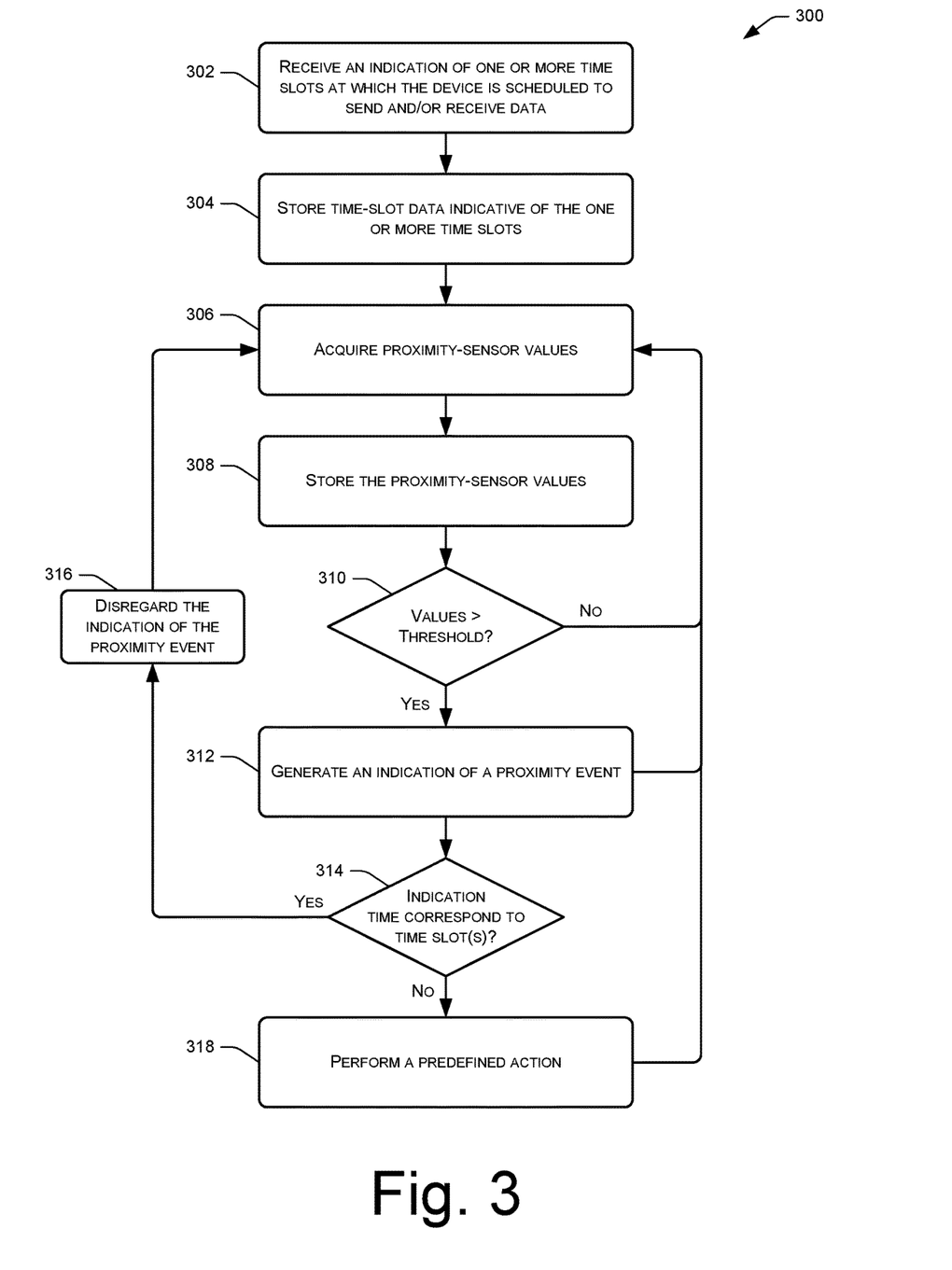
FIG. 3 illustrates an example process for disregarding interrupts generated by a proximity sensor of an electronic device when the interrupt corresponds to a time associated with a recurrent time slot at which the device is scheduled to send or receive data.

FIG. 3 illustrates an example process 300 for disregarding indications (e.g., interrupts) generated by a proximity sensor of an electronic device when the interrupt corresponds to a time associated with a time slot (e.g., a recurrent time slot) at which the device is scheduled to send or receive data. The processes described herein are illustrated as a collection of blocks in a logical flow graph, which represent a sequence of operations that can be implemented in hardware, software, or a combination thereof. In the context of software, the blocks represent computer-executable instructions that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes. In some instances, the proximity-sensor component 112, the proximity-determination logic 118, one or more other components, and/or some combination thereof may perform some or all of the operations described in the following processes.

At an operation 302, an electronic device, such as the device 102(1) receives data indicating one or more time slots at which the device is scheduled to send and/or receive data. In some instances, a network to which the device connects assigns the time slots to the device, as well as to other devices on the network. Further, while the time slots may comprise recurrent time slots in some instances, in other instances they do not.

At an operation 304, the electronic device stores time-slot data indicating the time slots, such that the proximity sensor and other components of the device are able to determine times at which the device will send or receive the data. At an operation 306, the proximity-sensor component 112 acquires one or more proximity-sensor values, which may comprise measuring a capacitance on one or more antennas of the device. In some instances, the proximity-sensor component 112 measures this capacitance on an antenna also used by the RF component 114. At an operation 308, the proximity-sensor component 112 stores the proximity-sensor values in memory of the device.

At an operation 310, the proximity-sensor component 112, or the proximity-determination logic 118, determines whether the proximity-sensor values are greater than a proximity-sensor-value threshold. For example, the component 112 or the logic 118 determines whether the measured capacitance is greater than a threshold capacitance, thus indicating a potential proximity event (e.g., that a human user is within a threshold distance of the device). If the component 112 or the logic 118 determines that the values are not greater than the threshold, then the proximity-sensor component 112 continues to acquire values at 306. If, however, the proximity-sensor component 112 or the proximity-determination logic 118 determines that the values are greater than a threshold, then at 312 the proximity-detection logic 118 or the component 112 generates an indication (e.g., an interrupt) of a proximity event. In addition, the proximity-sensor component 112 may continue to acquire the proximity-sensor values.

At an operation 314, however, the proximity-determination component 112 or the logic 118 determines whether the time of the indication of the proximity event corresponds to a time of the time slots at which the device has been scheduled to send or receive data. If so, then at an operation 316 the proximity-sensor component 112 or the proximity-determination logic 118 may disregard the indication. For instance, based on disregarding this indication, the device may refrain from performing one or more predefined actions associated with detecting a proximity event, such as lessening power consumed by the antenna. If, however, the time of the indication does not correspond to a time at which the device is scheduled to send and/or receive data, then at an operation 318, the device may perform the one or more predefined operations associated with the detecting of a proximity event.

Figure 4:
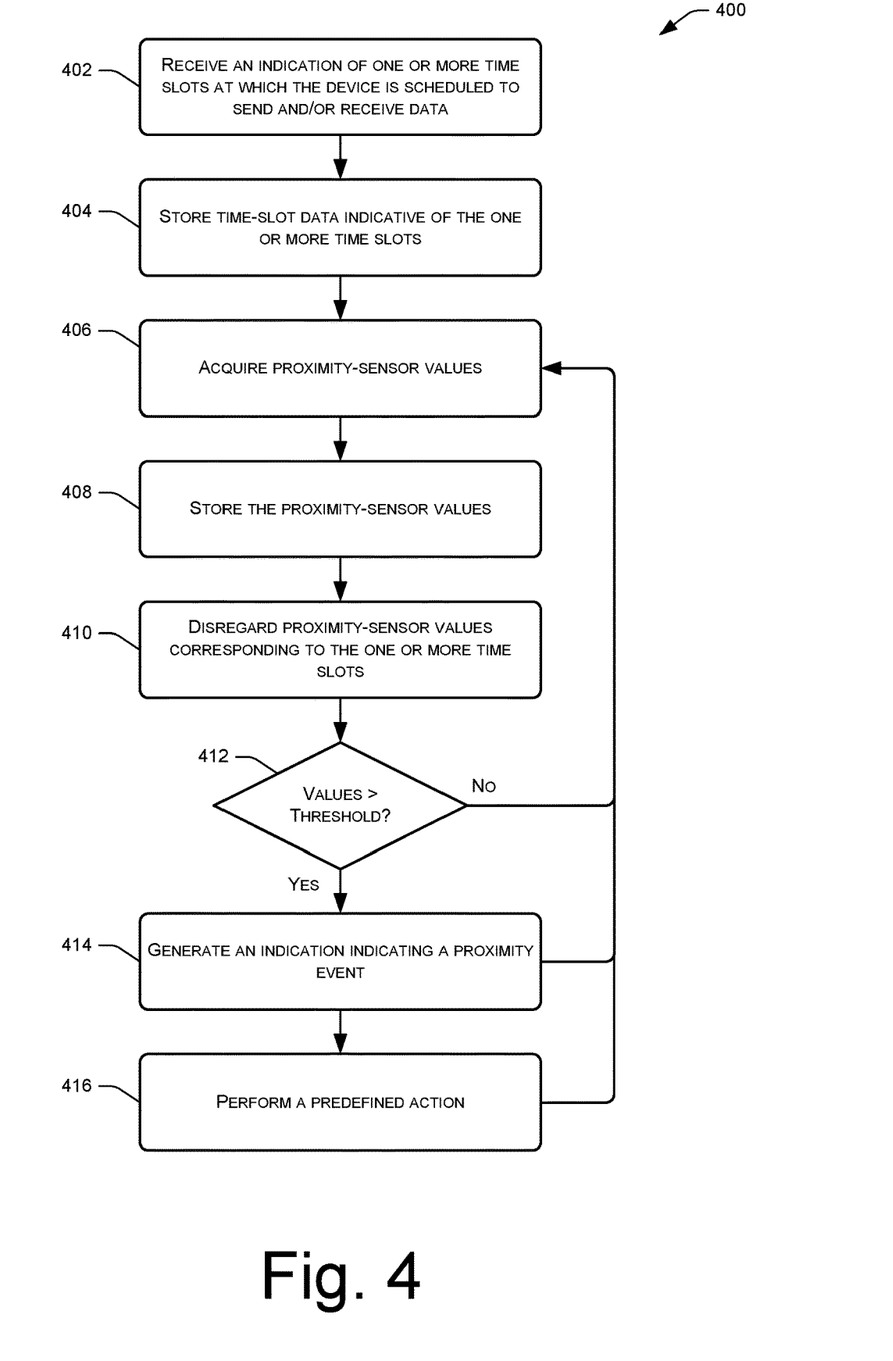
FIG. 4 illustrates an example process for disregarding proximity-sensor values corresponding to times associated with a recurrent time slot at which the device is scheduled to send or receive data.

FIG. 4 illustrates an example process 400 for disregarding proximity-sensor values corresponding to times associated with a time slot (e.g., a recurrent time slot) at which the device is scheduled to send or receive data. At an operation 402, an electronic device, such as the device 102(1) receives data indicating one or more time slots at which the device is scheduled to send and/or receive data. In some instances, a network to which the device connects assigns the time slots to the device, as well as to other devices on the network. Further, while the time slots may comprise recurrent time slots in some instances, in other instances they do not.

At an operation 404, the electronic device stores time-slot data indicating the time slots, such that the proximity sensor and other components of the device are able to determine times at which the device will send or receive the data. At an operation 406, the proximity-sensor component 112 acquires one or more proximity-sensor values, which may comprise measuring a capacitance on one or more antennas of the device. In some instances, the proximity-sensor component 112 measures this capacitance on an antenna that is also used by the RF component 114 to send and/or receive data. At an operation 408, the proximity-sensor component 112 stores the proximity-sensor values in memory of the device.

At an operation 410, the proximity-determination logic 118 and/or the proximity-sensor component 112 disregards proximity-sensor values corresponding to the time slot(s) at which the device is scheduled to send and/or receive data. As described above, this may include deleting these values from memory, disregarding these values when perform proximity calculations (e.g., comparing measured capacitance to the threshold), or the like.

At an operation 412, the proximity-sensor component 112 or the proximity-determination logic 118 determines whether the proximity-sensor values are greater than a proximity-sensor-value threshold. For example, the component 112 or the logic 118 determines whether the measure capacitance is greater than a threshold capacitance, thus indicating a potential proximity event (e.g., that a human user is within a threshold distance of the device). If the component 112 or the logic 118 determines that the values are not greater than the threshold, then the proximity-sensor component 112 continues to acquire values at 406. If, however, the proximity-sensor component 112 or the proximity-determination logic 118 determines that the values are greater than a threshold, then at 414 the proximity-detection logic 118 or the component 112 generates an indication (e.g., an interrupt) of a proximity event. In addition, the proximity-sensor component 112 may continue to acquire the proximity-sensor values.

At an operation 416, the device may perform any predefined actions associated with detecting a proximity event, such as lessening power consumed by the antenna. That is, because the values corresponding to the times at which the device was scheduled to send and/or receive data have been disregarded, any proximity-event indications may be relied upon to represent true proximity events.

Figure 5:
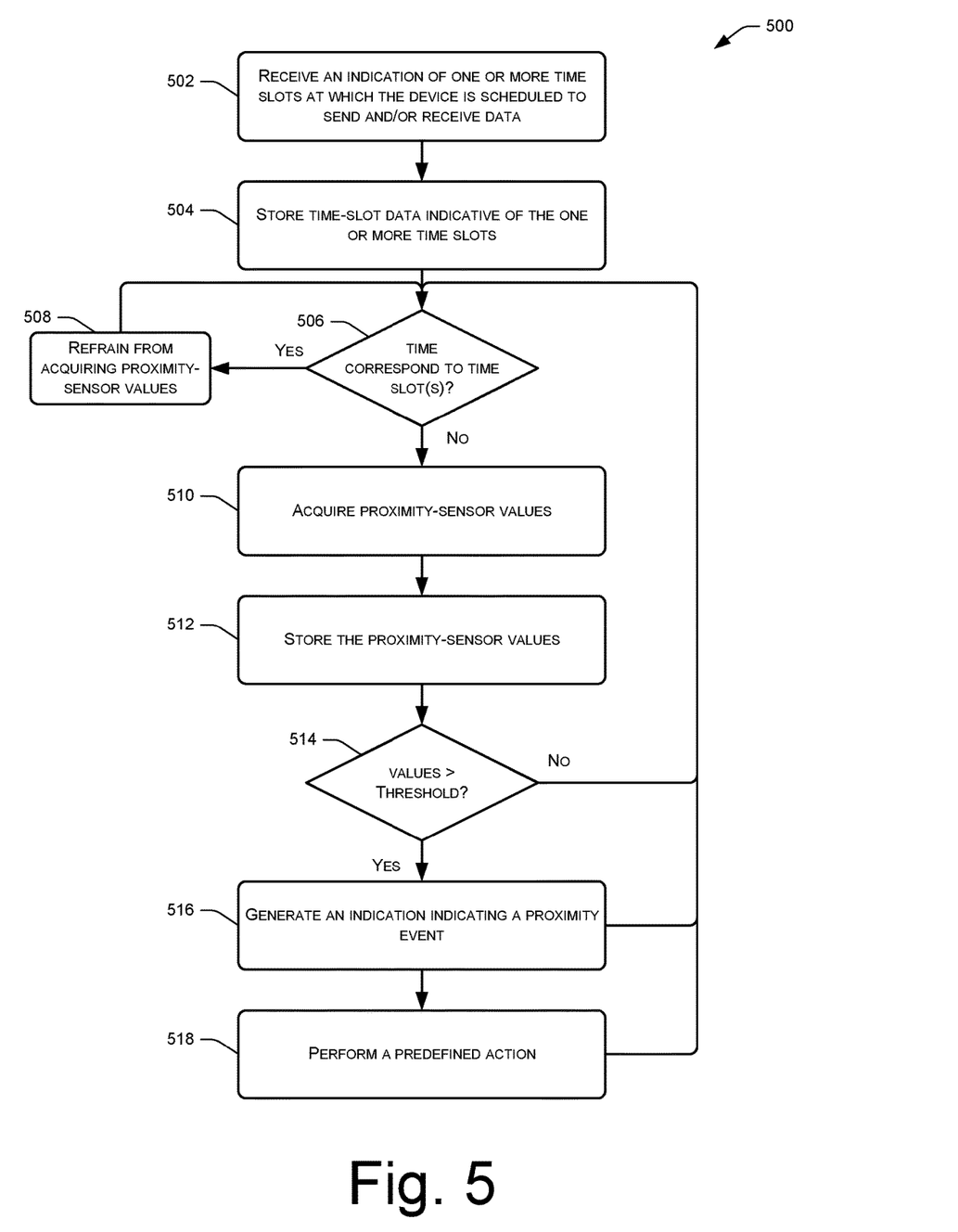
FIG. 5 illustrates an example process for refraining from acquiring proximity-sensor values at times corresponding to a recurrent time slot at which the device is scheduled to send or receive data. For instance, the proximity sensor may be powered off at these times.

FIG. 5 illustrates an example process 500 for refraining from acquiring proximity-sensor values at times corresponding to a time slot (e.g., a recurrent time slot) at which the device is scheduled to send or receive data. For instance, the proximity-sensor component 112 may be powered off at these times.

At an operation 502, an electronic device, such as the device 102(1) receives data indicating one or more time slots at which the device is scheduled to send and/or receive data. In some instances, a network to which the device connects assigns the time slots to the device, as well as to other devices on the network. Further, while the time slots may comprise recurrent time slots in some instances, in other instances they do not.

At an operation 504, the electronic device stores time-slot data indicating the time slots, such that the proximity sensor and other components of the device are able to determine times at which the device will send or receive the data. At an operation 506, the proximity-sensor component 112 or the proximity-determination logic 118 determines whether the current time corresponds to a time slot at which the device is scheduled to send and/or receive data. If so, then at an operation 508 the proximity-sensor component 112 refrains from acquiring proximity-sensor values. In some instances, this may include powering off some or all of the proximity sensor. The process 500 then returns to the determination of whether the current time corresponds to the time slots.

If, however, the proximity-sensor component 112 or the proximity-determination logic 118 determines that the current time does not correspond to the time slots at which the device is scheduled to send or receive data, then at an operation 510 the proximity-sensor component 112 acquires one or more proximity-sensor values, which may comprise measuring a capacitance on one or more antennas of the device. In some instances, the proximity-sensor component 112 measures this capacitance using an antenna also used by the RF component 114. At an operation 512, the proximity-sensor component 112 stores the proximity-sensor values in memory of the device.

At an operation 514, the proximity-sensor component 112 or the proximity-determination logic 118 determines whether the proximity-sensor values are greater than a proximity-sensor-value threshold. For example, the component 112 or the logic 118 determines whether the measure capacitance is greater than a threshold capacitance, thus indicating a potential proximity event (e.g., that a human user is within a threshold distance of the device). If the component 112 or the logic 118 determines that the values are not greater than the threshold, then the process 500 returns to the operation 506 of determining whether the current time corresponds to a time slot at which the device is scheduled to send or receive data.

If, however, the proximity-sensor component 112 or the proximity-determination logic 118 determines that the values are greater than a threshold, then at 516 the proximity-detection logic 118 or the component 112 generates an indication (e.g., an interrupt) of a proximity event. In addition, the proximity-sensor component 112 may continue to acquire the proximity-sensor values.

At an operation 518, the device may perform any predefined actions associated with detecting a proximity event, such as lessening power consumed by the antenna. That is, because the values corresponding to the times at which the device was scheduled to send and/or receive data have been disregarded, any proximity-event indications may be relied upon to represent true proximity events.

The processes discussed herein may be implemented in hardware, software, or a combination thereof. In the context of software, the described operations represent computer-executable instructions stored on one or more computer-readable storage media that, when executed by one or more hardware processors, perform the recited operations. Generally, computer-executable instructions include routines, programs, objects, components, data structures, and the like that perform particular functions or implement particular abstract data types. Those having ordinary skill in the art will readily recognize that certain steps or operations illustrated in the figures above may be eliminated, combined, or performed in an alternate order. Any steps or operations may be performed serially or in parallel. Furthermore, the order in which the operations are described is not intended to be construed as a limitation.

Embodiments may be provided as a software program or computer program product including a non-transitory computer-readable storage medium having stored thereon instructions (in compressed or uncompressed form) that may be used to program a computer (or other electronic device) to perform processes or methods described herein. The computer-readable storage medium may be one or more of an electronic storage medium, a magnetic storage medium, an optical storage medium, a quantum storage medium, and so forth. For example, the computer-readable storage media may include, but is not limited to, hard drives, floppy diskettes, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further, embodiments may also be provided as a computer program product including a transitory machine-readable signal (in compressed or uncompressed form). Examples of machine-readable signals, whether modulated using a carrier or unmodulated, include, but are not limited to, signals that a computer system or machine hosting or running a computer program can be configured to access, including signals transferred by one or more networks. For example, the transitory machine-readable signal may comprise transmission of software by the Internet.

Separate instances of these programs can be executed on or distributed across any number of separate computer systems. Thus, although certain steps have been described as being performed by certain devices, software programs, processes, or entities, this need not be the case, and a variety of alternative implementations will be understood by those having ordinary skill in the art.

Additionally, those having ordinary skill in the art readily recognize that the techniques described above can be utilized in a variety of devices, environments, and situations. Although the subject matter has been described in language specific to structural features or methodological acts, it is to be understood that the subject matter defined in the appended claims is not necessarily limited to the specific features or acts described. Rather, the specific features and acts are disclosed as exemplary forms of implementing the claims.

What is claimed is:

1. A method implemented least in part by an electronic device that includes a radio-frequency (RF) component and a proximity-sensor component, the method comprising:
    determining a first time slot at which the RF component is scheduled to at least one of send or receive data over a network;

storing first data indicating the first time slot;
acquiring, using the proximity-sensor component and over a first antenna, one or more first proximity-sensor values during a second time slot at which the RF component is not scheduled to send or receive data;
determining that the electronic device is within a threshold distance to an object based at least in part on the one or more first proximity-sensor values and without reference to proximity-sensor values acquired at the first time slot; and
sending, using the RF component and over a second antenna, second data to a remote device during the first time slot.

2. The method as recited in claim 1, wherein determining the first time slot comprises determining a recurrent time slot of multiple recurrent time slots for a particular frequency channel, wherein each of the multiple recurrent time slots for the particular frequency channel is assigned to a respective electronic device.

3. The method as recited in claim 1, further comprising:
acquiring, using the proximity-sensor component, one or more second proximity-sensor values during the first time slot; and
generating an indication that the electronic device is within the threshold distance of the object based at least in part on the one or more first proximity-sensor values and without reference to the one or more second proximity-sensor values.

4. The method as recited in claim 1, further comprising:
acquiring, using the proximity-sensor component, one or more second proximity-sensor values during the first time slot;
deleting the one or more second proximity-sensor values; and
generating an indication that the electronic device is within the threshold distance of the object based at least in part on the one or more first proximity-sensor values.

5. The method as recited in claim 1, further comprising:
powering off at least a portion of the proximity-sensor component during the first time slot; and
powering on the at least the portion of the proximity-sensor component during the second time slot.

6. The method as recited in claim 1, further comprising:
acquiring, using the proximity-sensor component, one or more second proximity-sensor values during the first time slot;
generating an indication that the electronic device is within the threshold distance of the object based at least in part on the one or more second proximity-sensor values; and
determining that the indication corresponds to the first time slot; and
disregarding the indication.

7. The method as recited in claim 1, further comprising:
sending, using the RF component and over the first antenna, first third data to the remote device during the first time slot;
and wherein acquiring the one or more first proximity-sensor values comprises acquiring the one or more first proximity-sensor values from the first antenna.

8. An electronic device comprising:
a radio-frequency (RF) component;
a proximity-sensor component; and
logic configured to perform acts comprising:
determining a first time slot at which the RF component of the electronic device is scheduled to at least one of send or receive data over a network;
storing first data indicating the first time slot;
receiving, from the proximity-sensor component and over a first antenna, one or more first proximity-sensor values acquired during a second time slot at which the RF component is not scheduled to send or receive data;
determining that the electronic device is within a threshold distance to an object based at least in part on the one or more first proximity-sensor values and without reference to proximity-sensor values acquired at the first time slot; and
sending, using the RF component and over a second antenna, second data to a remote device during the first time slot.

9. The electronic device as recited in claim 8, wherein determining the first time slot comprises determining a recurrent time slot of multiple recurrent time slots for a particular frequency channel, wherein each of the multiple recurrent time slots for the particular frequency channel is assigned to a respective electronic device.

10. The electronic device as recited in claim 8, wherein the logic is further configured to perform acts comprising:
receiving, from the proximity-sensor component, one or more second proximity-sensor values acquired during the first time slot; and
generating an indication that the electronic device is within the threshold distance of the object based at least in part on the one or more first proximity-sensor values and without reference to the one or more second proximity-sensor values.

11. The electronic device as recited in claim 8, wherein the logic is further configured to perform acts comprising:
receiving, from the proximity-sensor component, one or more second proximity-sensor values acquired during the first time slot;
deleting the one or more second proximity-sensor values; and
generating an indication that the electronic device is within the threshold distance of the object based at least in part on the one or more first proximity-sensor values.

12. The electronic device as recited in claim 8, wherein the logic is further configured to perform acts comprising:
powering off at least a portion of the proximity-sensor component during the first time slot; and
powering on the at least the portion of the proximity-sensor component during the second time slot.

13. The electronic device as recited in claim 8, wherein the logic is further configured to perform an act comprising:
receiving, from the proximity-sensor component, one or more second proximity-sensor values acquired during the first time slot;
generating an indication that the electronic device is within the threshold distance of the object based at least in part on the one or more second proximity-sensor values; and
determining that the indication corresponds to the first time slot; and
disregarding the indication.

14. The electronic device as recited in claim 8, further comprising the first antenna coupled to the RF component and to the proximity-sensor component, and wherein the logic is further configured to perform acts comprising:
sending, using the RF component and over the first antenna, first third data to the remote device during the first time slot.

15. The electronic device as recited in claim 8, further comprising:
   the second antenna coupled to the RF component; and
   the first antenna coupled to the proximity-sensor component.

16. A method comprising:
   determining a first time slot at which a radio-frequency (RF) component of an electronic device is scheduled to at least one of send or receive data over a network;
   acquiring, using a proximity-sensor component of the electronic device and over a first antenna, one or more first proximity-sensor values during a second time slot at which the RF component is not scheduled to send or receive data;
   determining that the electronic device is within a threshold distance to an object based at least in part on the one or more first proximity-sensor values; and
   sending, using the RF component and over a second antenna, second data to a remote device during the first time slot.

17. The method as recited in claim 16, wherein determining the first time slot comprises determining a recurrent time slot of multiple recurrent time slots for a particular frequency channel, wherein each of the multiple recurrent time slots for the particular frequency channel is assigned to a respective electronic device.

18. The method as recited in claim 16, further comprising:
   acquiring, using the proximity-sensor component, one or more second proximity-sensor values during the first time slot; and
   generating an indication that the electronic device is within the threshold distance of the object based at least in part on the one or more first proximity-sensor values and without reference to the one or more second proximity-sensor values.

19. The method as recited in claim 16, further comprising:
   acquiring, using the proximity-sensor component, one or more second proximity-sensor values during the first time slot;
   deleting the one or more second proximity-sensor values; and
   generating an indication that the electronic device is within the threshold distance of the object based at least in part on the one or more first proximity-sensor values.

20. The method as recited in claim 16, further comprising:
   powering off at least a portion of the proximity-sensor component during the first time slot; and
   powering on the at least the portion of the proximity-sensor component during the second time slot.

* * * * *

UNITED STATES PATENT AND TRADEMARK OFFICE
CERTIFICATE OF CORRECTION

PATENT NO. : 10,469,079 B1
APPLICATION NO. : 15/839465
DATED : November 5, 2019
INVENTOR(S) : Mudit Sunilkumar Khasgiwala et al.

It is certified that error appears in the above-identified patent and that said Letters Patent is hereby corrected as shown below:

In the Claims

Column 15, Line 56, change "antenna, first third data to the remote device during the..." to -- antenna, third data to the remote device during the... --; and Column 16, Line 66, change "antenna, first third data to the remote device during the..." to -- antenna, third data to the remote device during the... --.

Signed and Sealed this
Eleventh Day of August, 2020

Andrei Iancu
*Director of the United States Patent and Trademark Office*